United States Patent [19]
So et al.

[11] Patent Number: 5,656,508
[45] Date of Patent: Aug. 12, 1997

[54] METHOD OF MAKING TWO DIMENSIONAL ORGANIC LIGHT EMITTING DIODE ARRAY FOR HIGH DENSITY INFORMATION IMAGE MANIFESTATION APPARATUS

[75] Inventors: Franky So, Tempe; Song Q. Shi, Phoenix; Thomas B. Harvey, III, Scottsdale, all of Ariz.

[73] Assignee: Motorola, Schaumburg, Ill.

[21] Appl. No.: 684,779

[22] Filed: Jul. 22, 1996

Related U.S. Application Data

[62] Division of Ser. No. 408,677, Mar. 22, 1995, Pat. No. 5,587,589.

[51] Int. Cl.⁶ .................................................. H01L 33/00
[52] U.S. Cl. .................................................. 438/34; 438/99
[58] Field of Search ........................ 437/1, 3, 5, 23, 437/127, 129, 203, 89, 90, 128; 257/40, 80, 81, 88, 10

[56] References Cited

U.S. PATENT DOCUMENTS 4,984,034  1/1991  Yamazaki .......................... 257/88
5,399,502  3/1995  Friend et al. ...................... 437/1

FOREIGN PATENT DOCUMENTS 2-244673(A)  9/1990  Japan ............................. 437/1
2-239663(A)  9/1990  Japan ............................. 437/1

*Primary Examiner*—John Niebling
*Assistant Examiner*—S. Mulpuri
*Attorney, Agent, or Firm*—Eugene A. Parsons

[57] ABSTRACT

A two dimensional array of organic LEDs including laterally spaced, conductive strips positioned on an insulative substrate with a layer of dielectric material positioned thereon and defining cavities therethrough so as to expose areas of the conductive strips within the cavities. At least a layer of active emitter material and a layer of a low work function metal are positioned in each of the cavities on the conductive strips so as to form an LED in each cavity with the conductive strips forming a first electrode of each LED. A layer of metal is sealing positioned over each of the cavities and formed into metallic strips orthogonal to the conductive strips so as to form a second electrode for each of the LEDs.

6 Claims, 1 Drawing Sheet

METHOD OF MAKING TWO DIMENSIONAL ORGANIC LIGHT EMITTING DIODE ARRAY FOR HIGH DENSITY INFORMATION IMAGE MANIFESTATION APPARATUS

This is a division of application Ser. No. 08/408,677, filed Mar. 22, 1995, Pat. No. 5,587,589.

FIELD OF THE INVENTION

The present invention relates to organic light emitting diode (LED) arrays and to a novel method of fabrication of organic LED arrays for high density information image manifestation apparatus applications.

BACKGROUND OF THE INVENTION

A two-dimensional organic LED array for image manifestation apparatus applications is composed of a plurality of organic LEDs (one or more of which form a pixel) arranged in rows and columns. Each individual organic LED in the array is generally constructed with a light transmissive first electrode, an organic electroluminescent medium deposited on the first electrode, and a metallic electrode on top of the organic electroluminescent medium. The electrodes of the LEDs are connected to form a two-dimensional X-Y addressing pattern. In practice, the X-Y addressing pattern is achieved by patterning the light transmissive electrodes in an X direction and patterning the metallic electrodes in a Y direction (or vice versa if desired), with the X and Y directions being perpendicular to each other. The patterning of the electrodes is usually accomplished by either shadow mask or etching techniques. Due to the technical limits of shadow masks, only etching processes are being utilized for high density information displays, which have pixel pitches less then 0.1 mm.

Depending on the medium used in the etching processes, the etching technique can be divided into two categories: wet and dry. While wet etching is performed in an acidic liquid medium, dry etching is usually done in a plasma atmosphere.

The metallic electrodes used for cathode contacts in organic LEDs usually contain a stable metal and a highly reactive metal with a work function less then 4 eV. The presence of the highly reactive metal in the metallic electrode makes acid-based wet etching undesirable. However, the dry etching processes is also problematic because of the high temperature (>200° C.) and reactive ion atmosphere required in the process, which may affect the integrity of the organic materials as well as the active metal containing metallic electrodes in a two-dimensional organic LED array.

To overcome the etching dilemma, a shadow wall method to fabricate the two-dimensional array has been disclosed by Tang in a patent application, EP92 122113.1, published by the European Patent Office on Jul. 7, 1993. The shadow wall method includes: patterning the transparent electrode first; building dielectric walls that are orthogonal to the transparent electrodes, capable of shadowing an adjacent pixel area, and with a height exceeding the thickness of the organic medium; depositing an organic electroluminescent medium; and depositing the cathode metals from an angle of 15° to 45° with respect to the deposition surface. Since the height of the dielectric walls exceeds the thickness of the organic medium, isolated parallel metal stripes are formed. Thus, a X-Y addressable array is achieved without the need of metal etching. Though this method seems to be viable for metal patterning, it is limited to certain pitch dimensions, and potentially could introduce defects in pixels in the array.

Accordingly, it would be highly advantageous to provide a new LED array and method of manufacturing which overcame these problems.

It is a purpose of this invention to provide a novel method of fabricating a two-dimensional organic LED array for high density information image manifestation apparatus applications.

It is another purpose of this invention to provide an organic LED device structure on which metal etching can be performed.

It is still another purpose of this invention to provide a passivated two-dimensional organic LED array for high density information image manifestation apparatus applications with improved reliability.

It is a further purpose of this invention to provide a new device structure for use in LED arrays which is relatively easy and inexpensive to manufacture.

SUMMARY OF THE INVENTION

The above problems and others are at least partially solved and the above purposes and others are realized in a new and novel two-dimensional organic LED array for high density information image manifestation apparatus applications. The LED array includes a number of parallel, spaced apart light transmissive first electrodes, an electroluminescent medium deposited on the first electrodes, and on top of the electroluminescent medium a number of parallel, spaced apart metallic second electrodes arranged orthogonal to the first electrodes. The electroluminescent medium is enclosed in a well or trench structure formed of dielectric medium with the light transmissive first electrode at the well or trench bottom and the second electrode of ambient stable metal at the top of the well or trench.

A novel method of fabrication of a two-dimensional organic LED array for high density information image manifestation apparatus applications is also disclosed.

DESCRIPTION OF THE PREFERRED EMBODIMENTS

Figure 1:
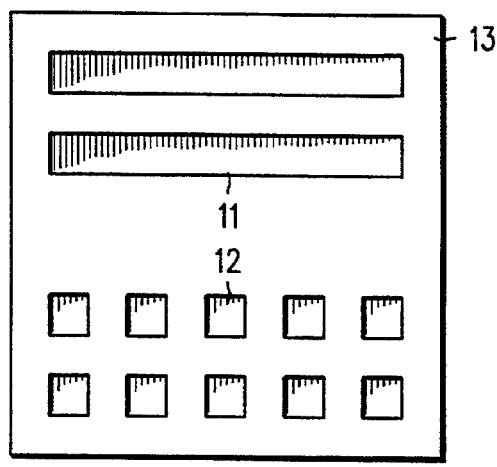
FIG. 1 is a plan view of a typical trench structure and a typical well Structure depicted on the same substrate to illustrate-their dimensional differences.

Since device feature dimensions are often in submicrometer ranges, the drawings are scaled for ease of visualization rather than dimensional accuracy. Referring specifically to FIG. 1, a plan view of typical trench 11 and well 12 structures is depicted on the same substrate to illustrate their dimensional differences. Both trenches 11 and wells 12 are generally formed by photolithographically patterning a dielectric layer 13 that has been deposited on top of light transmissive, conductive strips (not shown) that are in turn supported by an underlying transparent insulating substrate.

Trenches 11 are long, narrow, straight, deep depressions, each defined by four relatively steep sides formed in dielectric layer 13. Typically, trenches 11 take the shape of a rectangular parallelepiped as shown in FIG. 1. Also, trenches 11 generally extend across the substrate in a direction either perpendicular to the underlying light transmissive, conductive strips or parallel to and on the top of the underlying light transmissive, conductive strips. A number of LEDs or pixels can be constructed in a single trench 11.

Wells 12 are each defined by a hole formed in dielectric layer 13 with a rectangular, square or circular shape of opening, and steep side walls. Wells 12 are characterized by small feature size and a nearly isotropic shape of opening. A number of wells 12 are constructed in a row across the substrate on the top of the light transmissive, conductive strips. Each well 12 defines the shape of an LED or pixel in a two-dimensional array. Either trenches 11 or wells 12, which are hereinafter referred to generally as cavities, can be used in the fabrication of a two-dimensional array for information image manifestation apparatus.

Figure 2:
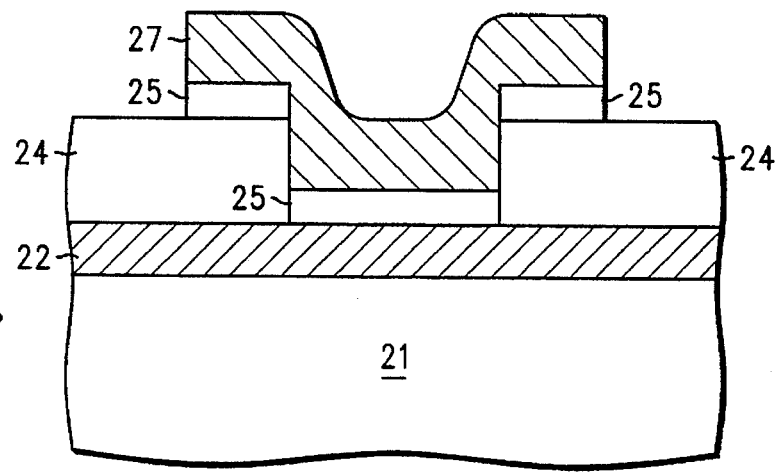
FIG. 2 is a cross sectional view of an LED in a two dimensional array according to the present invention.

Now referring specifically to FIG. 2, a cross sectional view of a single LED 20, from a two dimensional LED array according to the present invention, is depicted. The construction of LED 20 begins with a light transmissive, preferably transparent, and electrically insulative substrate 21. Substrates made of glass and polymeric materials are generally preferred. On the upper surface of substrate 21 is deposited a layer 22 of light transmissive, electrically conductive material, which is selected from a variety of organic or inorganic conductors, such as conductive polyaniline (PANI), or indium-tin-oxide (ITO). Layer 22 is then patterned by conventional lithography technique to form a first parallel conductive strip 23 that is capable of being addressed in a row fashion and will serve as an anodic electrode in the final array.

On the top of patterned layer 22, a layer 24 of dielectric medium is deposited by thermal evaporation, sputtering or plasma enhanced chemical vapor deposition techniques. Layer 24 is then patterned by conventional wet or dry etch techniques to form a cavity (well or a trench) structure. Inside the cavity, and on the upper surface of layer 23 (the anodic electrode), is deposited an electroluminescent medium 25, which generally consists of a layer of hole transporting material, a layer of active emitter material, a layer of electron transporting material and a layer of a low work function metal. It will of course be understood by those skilled in the art that in some applications either or both of the layers of hole transporting material and electron transporting material can be eliminated, in most instances with a result of somewhat poorer operation.

The top of the cavity is then sealed by evaporation of a thick layer 27 of stable metal such as aluminum, silver, copper or gold as a cavity cap. Layer 27 is selected to form a good electrical contact with the layer of low work function material in electroluminescent medium 25 and, in conjunction with the layer of low work function metal of electroluminescent medium 25, forms the cathode electrode for LED 20. Layer 27 is then lithographically patterned to form an isolated metal strip to provide LED addressing, as previously described.

Dielectric medium 24, used in the construction of the cavity structure, is any convenient organic polymer or inorganic material. However, it is preferred to use an inorganic dielectric material such as silicon dioxide, silicon nitride, alumina, etc. which is usually a better barrier to oxygen and moisture then organic polymer materials. The thickness of dielectric medium 24, which determines the depth of the cavity structures, may vary from 10 μm to 0.1 μm and, for ease of processing, a thickness of less then 1 μm is preferred.

The materials used as electroluminescent medium 25 in the two-dimensional array of this invention can include any of the materials of organic EL devices disclosed in the prior art. As stated above, electroluminescent medium 25 generally consists of a layer of hole transporting material, a layer of active emitter material, a layer of electron transporting material and a layer of low work functional metal in a successive order. Polymers, organic molecules and organometallic complexes can be used as hole transporting materials, active emitters and electron transporting materials. In the active emitter layer, a fluorescent dopant used for enhancement of the device efficiency can also be incorporated. Generally, any metals with a work function less than approximately 4.0 eV can be used as the cathode material, e.g. lithium, magnesium, indium, calcium, etc.

The organic electroluminescent media can be deposited by vacuum evaporation. Organic electroluminescent media can also be deposited by other techniques such as injection-fill, spin-coating, roll-coating, dip-coating or doctor-blading from a suitable solution when polymeric materials are used. A mixture of the above-mentioned techniques may be needed in cases where a heterostructure array composed of both small organic molecule materials and polymers is to be built.

Figure 3:
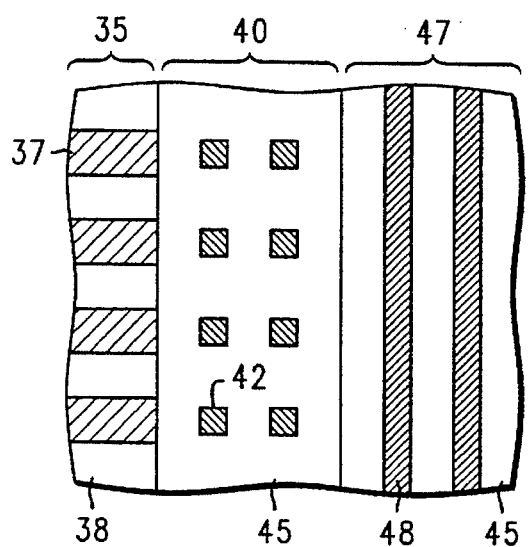
FIG. 3 is a plan view of a two dimensional organic LED array with well structures in accordance with the present invention, portions thereof broken away for ease of visualization.

Referring now to FIG. 3, a plan view of a two-dimensional array 30 of LED well structures embodying the present invention is illustrated, with portions broken away for ease of visualization. Proceeding from left to right in FIG. 3, an area 35 is a plan view of array 30 at a stage where patterned transmissive, conductive strips 37, forming row (anode) electrodes, are positioned on a light transmissive, electrically insulative substrate 38.

A central area 40 in FIG. 3 illustrates a stage where individual LEDs 42 are defined by wells containing organic electroluminescent medium and low (less than 4.0 eV) work function metal as an n-contact (cathode). The wells are formed in the array after depositing a layer of dielectric medium 45 on top of patterned strips 37 and substrate 38 and patterning the dielectric medium 45 photolithographically to form the well structures, as illustrated in area 40.

An area 47 is a plan view of the array after a layer of an ambient stable metal cap has been deposited on top of dielectric medium 45 with the well structures formed therein (area 40) and patterned into metal strips 48 as column electrodes.

An array bearing trench structures can be fabricated in the same fashion as the array bearing well structures, with the exception that the orientation of the trench structures can be either parallel to and on top of conductive strips 37 or perpendicular to and across all of conductive strips 37. When the trench structures are oriented parallel to and on top of conductive strips 37, two sides of each pixel are exposed after metal strips 48 are patterned orthogonal to conductive strips 37 to form an X-Y matrix. However, the exposed portions of array 30 would adversely affect the integrity of the organic electroluminescent medium and the low work function metal during the cap metal patterning. Thus, it is preferred that the trench structures be oriented perpendicular to and across all conductive strips 37 in array 30.

The number of LEDs and the LED pitch, that is the diameter of a well or the width of a trench in an array, needed for high density information image manifestation apparatus are dependent upon the resolution and size of the image manifestation apparatus required for a specific application. For example, 640×480 LEDs with LED pitch around 0.3 mm will be needed for a 10 inch diagonal monochrome VGA type of image manifestation apparatus. The LED pitch is confined only by the limit of lithography technology, which is around 0.5 μm in current manufacturing technology.

Two-dimensional array 30 has superior stability over arrays disclosed in the prior art. The organic electroluminescent medium, including the n-contact of low work function metal, in LEDs 42 (well structures) or a row of LEDs (trench structures) are enclosed in a cavity by light transmissive conductive strips 37 at the bottom, dielectric medium 45 on the sides and a stable metal cap (metal strips 48) on the top. The disclosed cavity structures significantly reduce the degradation of the array by ambient (oxygen and moisture) conditions.

In operation, a pattern of light emission from array 30 can be seen at the bottom surface of transparent substrate 38, through appropriate addressing and control of array 30 in a well known manner. Array 30 is driven to emit light by a programmed electronic driver (not shown), which sequentially addresses one row of pixels at a time and repeats the addressing sequence at such a rate that the interval between repeated addressing of the same row is less than the detection limit of the human eye, typically less that 1/60th of a second. The viewer sees an image formed by the light emission from all of the addressed rows, though the device at any moment is emitting from only one row.

Thus, a two dimensional array of LEDs for high density information image manifestation apparatus and fabrication methods are disclosed. The two dimensional array is fabricated by a novel method involving cavities in which the organic electroluminescent medium, including the n-contact of low work function metal, is protected from any etchants used during the fabrication process and from ambient conditions subsequent to fabrication. Thus, an organic LED device structure is disclosed on which metal etching can conveniently be performed without deleterious results. Also, the cavity structure provides a passivated two-dimensional organic LED array for high density information image manifestation apparatus applications with improved reliability. Further, because the cavity structure protects the organic electroluminescent medium, including the n-contact of low work function metal, from damage by etchants, the LED arrays are relatively easy and inexpensive to manufacture.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a two-dimensional organic light emitting diode array for high density information image manifestation apparatus comprising:

providing an electrically insulative substrate with a planar surface;

depositing a layer of electrically conductive material on the planar surface of the substrate;

patterning the layer of electrically conductive material to form a plurality of laterally spaced, conductive strips defining first electrodes;

depositing a layer of dielectric medium on a surface of the conductive strips and the planar surface of the substrate;

depositing a layer of photoresist on the layer of dielectric medium;

patterning the photoresist using a cavity defining mask to expose portions of the dielectric medium;

etching away the exposed portions of the dielectric medium to form a plurality of laterally spaced cavities, each of the plurality of cavities being positioned on an associated one of the defined first electrodes and exposing therein the associated first electrode;

striping off the photoresist;

depositing in each of the cavities an electroluminescent medium in the successive order of a layer of hole transporting material, a layer of active organic emitter, a layer of electron transporting material and a layer of a low work functional metal;

depositing a layer of ambient stable metal on the dielectric medium so as to sealingly overlie each of the cavities and electrically contact the layer of low work function metal in the cavities; and patterning the layer of ambient stable metal into metal strips in a direction orthogonal to the conductive strips so as to define second electrodes sealing each of the plurality of cavities.

2. A method of fabricating a two-dimensional organic light emitting diode array for high density information image manifestation apparatus as claimed in claim 1 wherein the step of providing a substrate includes providing a substrate that is light transmissive.

3. A method of fabricating a two-dimensional organic light emitting diode array for high density information image manifestation apparatus as claimed in claim 1 wherein the step of depositing a layer of electrically conductive material on the upper surface of the substrate includes depositing a layer of material that is also light transmissive.

4. A method of fabricating a two-dimensional organic light emitting diode array for high density information image manifestation apparatus as claimed in claim 1 wherein the step of depositing in each of the cavities an electroluminescent medium includes depositing the medium by one of the following methods: sputtering, thermal evaporating, injection-filling, spin-coating, roll-coating, dip-coating or doctor-blading.

5. A method of fabricating a two-dimensional organic light emitting diode array for high density information image manifestation apparatus including the steps of:

providing a light transmissive, electrically insulative substrate with a planar surface;

depositing a layer of light transmissive, electrically conductive material on the planar surface of the substrate;

patterning the layer of conductive material to form a plurality of laterally spaced apart, parallel conductive strips defining first electrodes;

depositing a layer of dielectric medium on an upper surface of the conductive strips and the planar surface of the substrate;

spin-coating a layer of photoresist on the layer of dielectric medium;

patterning the photoresist using a cavity defining mask to expose portions of the layer of dielectric medium;

etching away the exposed portions of the dielectric medium to form a plurality of laterally spaced cavities, one each of the plurality of cavities being positioned on an associated electrode of the first electrodes and exposing a surface of the associated electrode;

striping off the photoresist;

depositing within each of the plurality of cavities an electroluminescent medium in the successive order of a layer of hole transporting material, a layer of active organic emitter, a layer of electron transporting material and a layer of a low work functional metal;

depositing a layer of ambient stable metal on the dielectric medium so as to sealingly cover the cavities; and patterning the layer of ambient stable metal into metal strips extending in a direction orthogonal to the conductive strips and sealingly engaged with the plurality of cavities and electrically engaged with the low work function metal in the cavities.

6. A method of fabricating a two-dimensional organic light emitting diode array for high density information image manifestation apparatus characterized by:

provlding an electrically insulative substrate with a planar surface;

depositing and patterning layer of electrically conductive material on the planar surface of the substrate so as to form a plurality of laterally spaced, conductive strips defining first electrodes on the substrate;

depositing a layer of dielectric medium on a surface of the conductive strips and the planar surface of the substrate;

patterning the layer of dielectric material to define a plurality of laterally spaced cavities therethrough, each of the plurality of cavities being positioned on an associated one of the defined first electrodes and exposing therein a portion of the associated first electrode;

depositing on the exposed portion of the associated first electrode in each of the cavities an electroluminescent medium including an active organic emitter and a layer of a low work function metal; and depositing and patterning layer of ambient stable metal on the dielectric medium so as to sealingly overlie each of the cavities and electrically contact the layer of low work function metal, the layer of ambient stable metal defining laterally spaced apart metal strips extending in a direction orthogonal to the conductive strips so as to define second electrodes sealing each of the plurality of cavities.

* * * * *